(12) United States Patent
Ren et al.

(10) Patent No.: US 8,390,024 B2
(45) Date of Patent: Mar. 5, 2013

(54) ELECTROSTATIC DISCHARGE (ESD) PROTECTION CIRCUIT

(75) Inventors: Liping Ren, Los Angeles, CA (US); Hsiao-Chin Tuan, Judong County (TW); Dah-Chuen Ho, Zhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 156 days.

(21) Appl. No.: 12/757,612

(22) Filed: Apr. 9, 2010

(65) Prior Publication Data

US 2011/0248383 A1 Oct. 13, 2011

(51) Int. Cl.
*H01L 27/06* (2006.01)
(52) U.S. Cl. .. 257/173; 257/175; 257/577; 257/E27.019
(58) Field of Classification Search .................. 257/173, 257/175, 577, E27.019
See application file for complete search history.

(56) References Cited

U.S. PATENT DOCUMENTS

| 7,525,779 | B2 * | 4/2009 | Chen et al. | 361/56 |
|---|---|---|---|---|
| 2006/0091464 | A1 * | 5/2006 | Hiraoka | 257/355 |
| 2008/0203424 | A1 * | 8/2008 | Chen et al. | 257/102 |
| 2008/0203534 | A1 | 8/2008 | Xu et al. | |
| 2009/0026493 | A1 * | 1/2009 | Hiraoka | 257/173 |
| 2010/0207163 | A1 * | 8/2010 | Yabu et al. | 257/173 |
| 2012/0037956 | A1 * | 2/2012 | Song et al. | 257/173 |

* cited by examiner

*Primary Examiner* — Victor A Mandala
(74) *Attorney, Agent, or Firm* — Lowe Hauptman Ham & Berner, LLP

(57) ABSTRACT

An electrostatic discharge (ESD) protection circuit includes at least one bipolar transistor. At least one isolation structure is disposed in a substrate. The at least one isolation structure is configured to electrically isolate two terminals of the at least one bipolar transistor. At least one diode is electrically coupled with the at least one bipolar transistor, wherein a junction interface of the at least one diode is disposed adjacent the at least one isolation structure.

20 Claims, 9 Drawing Sheets ion circuits.
ELECTROSTATIC DISCHARGE (ESD) PROTECTION CIRCUIT

TECHNICAL FIELD

The present disclosure relates generally to the field of semiconductor circuits, and more particularly, to electrostatic discharge (ESD) protection circuits.

BACKGROUND

There are two types of damage in integrated circuit (IC) products that need to be protected: a high ESD current due to ESD event and a high voltage spike due to an inductive load. ESD protection mechanisms generally work in two ways. By dissipating the ESD current transient safely using a low-impedance discharging channel that prevents thermal damages in the structures of the integrated circuit. Ideally, the complete ESD protection solution should be realized on the integrated circuit (IC) creating an effective discharging channel from any pin to every other pin on the integrated circuit.

Devices that are used as ESD protection elements include diodes, bipolar transistors, metal-oxide-semiconductor field effect transistors (MOSFETs), and silicon-controlled rectifiers (SCRs). SCRs function as switches that can be configured to turn on and shunt voltage from the input/output (I/O) pads of an integrated circuit to ground.

In ESD protection some integrated circuit elements may be vulnerable by discharges occurring within automated equipment, while others may be more prone to damage from handling by personnel. This can occur from direct transfer of electrostatic charge from the human body or from a charged material to the electrostatic discharge sensitive (ESDS) element. When one walks across a floor, an electrostatic charge accumulates on the body. Simple contact of a finger to the leads of an ESDS device or assembly allows the body to discharge, possibly causing device damage. The model used to simulate this event is the Human Body Model (HBM).

The HBM testing model represents the discharge from the fingertip of a standing individual delivered to the device. It is modeled by a 100-picofarad (pF) capacitor discharged through a switching component and a 1.5-kOhm (kΩ) series resistor into the component. Typically, integrated circuit designers would like to see protection from the HBM testing to be greater than 2,000 volts.

An electrostatic discharge can also occur from a charged conductive object, such as a metallic tool or fixture. To test for this, designers use the Machine Model (MM). The machine model consists of a 200-pF capacitor discharged directly into a circuit without a series resistor. Typically, integrated circuit designers would like to see protection from the machine model to be greater than 200 volts.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
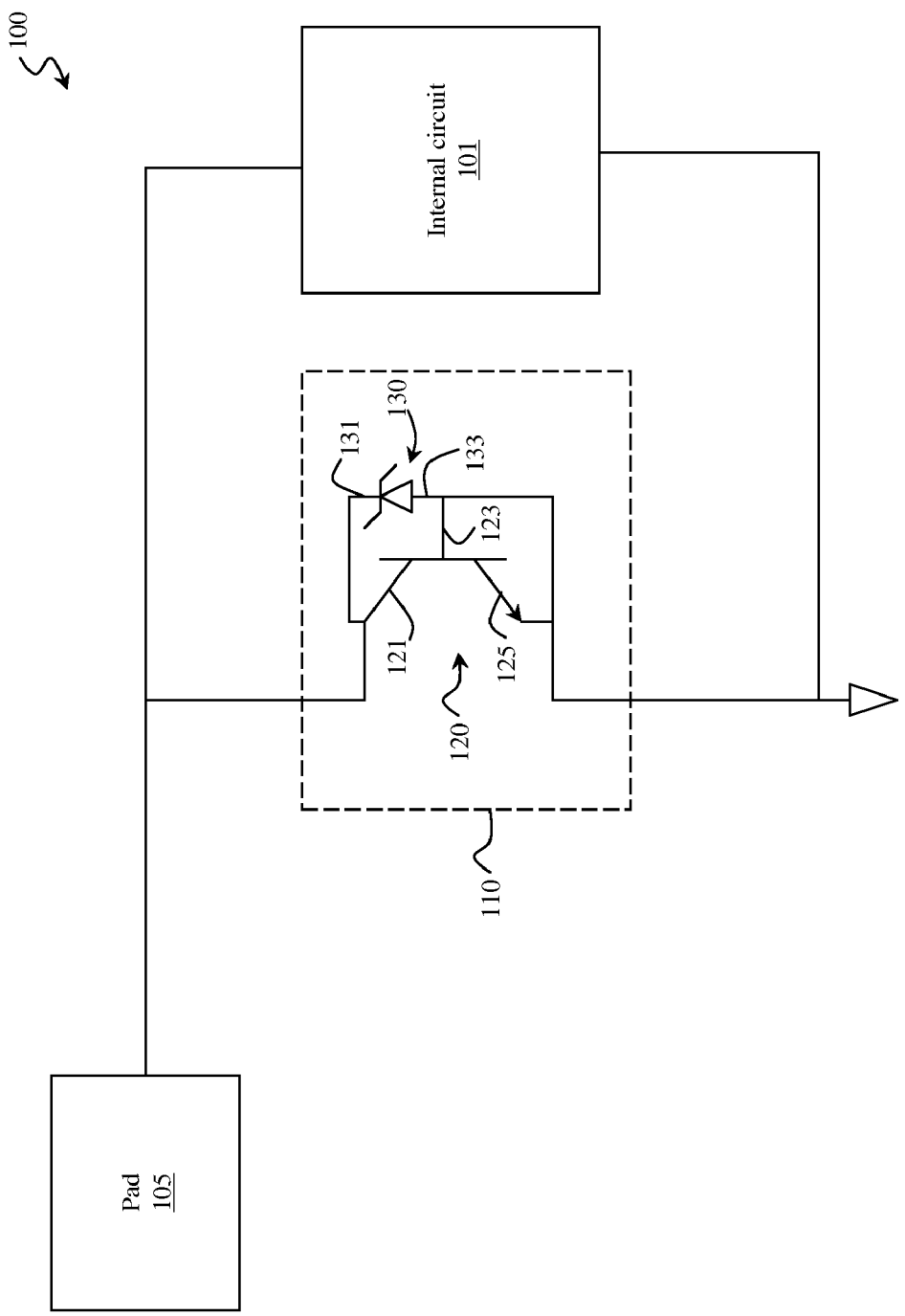
FIG. 1 is a schematic drawing showing an exemplary integrated circuit including an electrostatic discharge (ESD) protection circuit.

Conventionally, grounded gate n-type metal-oxide-semiconductor devices (GGNMOS) and resistor-capacitor (RC) triggered field effect transistor (FET) have been used as ESD protection devices for high voltage (HV) power integrated circuits (ICs). However, not only GGNMOS devices and RC triggered FETs are large, consuming a large area of the chip, but also suffer from the disadvantage that current densities provided by the GGNMOS devices and RC triggered FETs are limited.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing showing an exemplary integrated circuit including an electrostatic discharge (ESD) protection circuit. In FIG. 1, an integrated circuit 100 can include an internal circuit 101. The internal circuit 101 can be electrically coupled with at least one pad, e.g., a pad 105, and an ESD protection circuit 110. The ESD protection circuit 110 is configured to release an ESD pulse that occurs on the pad 105, such that the internal circuit 101 can be protected.

In some embodiments, the integrated circuit 100 can be a power switching circuit, a liquid crystal display (LCD) driver, a memory circuit, a digital circuit, an analog circuit, a mixed-signal circuit, or any other integrated circuit that is subjected to an ESD pulse. In some embodiments, the internal circuit 101 can include, for example, an LCD driver internal circuit, a static random access memory (SRAM) array, an embedded SRAM array, a dynamic random access memory (DRAM) array, an embedded DRAM array, a field-programmable gate array, a non-volatile memory, e.g., FLASH, EPROM, E²PROME, a logic internal circuit, an analog internal circuit, a mixed-signal internal circuit, other integrated circuits, and/or any combinations thereof.

Referring to FIG. 1, the ESD protection circuit 110 can include at least one bipolar transistor, e.g., a bipolar transistor 120, electrically coupled with at least one diode 130. In some embodiments, the bipolar transistor 120 can include a collector terminal 121, a base terminal 123, and an emitter terminal 125. The collector terminal 121 can be electrically coupled with the pad 105. The emitter terminal 125 and the base terminal 123 can be electrically coupled with a power line for providing a power voltage, e.g., power voltage $V_{SS}$ or ground.

In some embodiments, the diode 130 can be a p/n junction diode, a zener diode, or any suitable diode. The diode 130 can have a diode node 131 that is electrically coupled with the collector terminal 121. Another diode node 133 of the diode 130 can be electrically coupled with the base terminal 123 and the emitter terminal 125.

During a normal operation, i.e., no ESD pulse occurring on the pad 105, an operating voltage applied to the pad 105 is smaller than a trigger voltage of the diode 130. The operating voltage does not turn on the bipolar transistor 120 and the diode 130. The normal operating voltage applied to the pad 105 can be supplied to the internal circuit 101 for its operation.

In some embodiments, if an ESD pulse occurs on the pad 105, a voltage drop across the diode 130 is raised. If the voltage drop across the diode 130 rises to or beyond a predetermined voltage level, e.g., a trigger voltage, the diode 130 can be turned on. The turned-on diode 130 can trigger the bipolar transistor 120 into a conduction mode. The triggered bipolar transistor 120 can release the ESD current. By releasing the ESD current, the internal circuit 105 can be substantially free from being damaged.

It is noted that the number of the bipolar transistor 120 and/or the diode 130 described above in conjunction with FIG. 1 is merely exemplary. In some embodiments, one or more the electrically-coupled bipolar transistor/diode can be electrically coupled with the combination of the bipolar transistor 120 and the diode 130 in a parallel fashion. The structure with the parallel bipolar transistors/diodes can be referred to as a multiple-fingers structure.

Figure 2A:
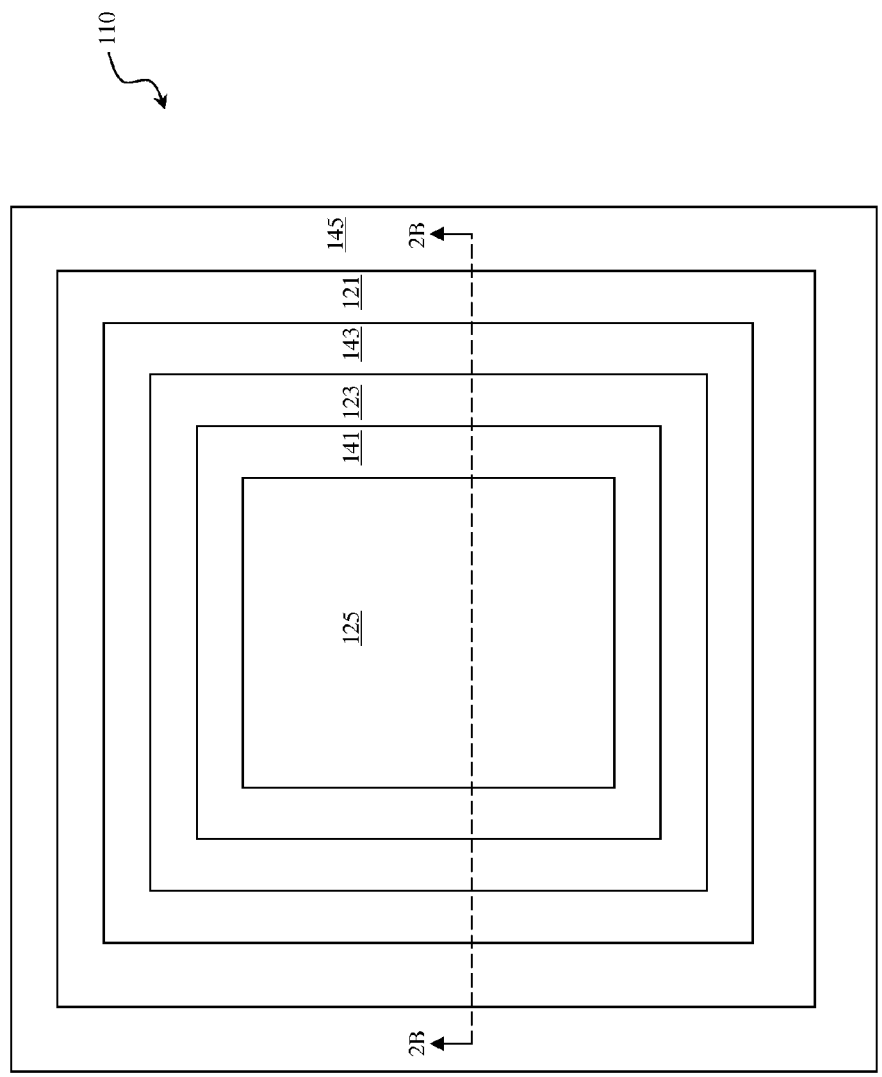
FIG. 2A is a schematic drawing illustrating a top view of an exemplary ESD protection circuit.

FIG. 2A is a schematic drawing illustrating a top view of an exemplary ESD protection circuit. In FIG. 2A, the ESD protection circuit 110 can include the collector terminal 121, the base terminal 123, and the emitter terminal 125. The base terminal 123 can be disposed around the emitter terminal 125. The collector terminal 121 can be disposed around the base terminal 123.

In some embodiments, at least one isolation structure, e.g., an isolation structure 141 can be optionally disposed between and electrically isolate the emitter terminal 125 and the base terminal 123. In other embodiments, at least one another isolation structure, e.g., an isolation structure 143, can be optionally disposed between and electrically isolate the base terminal 123 and the collector terminal 121. In still other embodiments, at least one the other isolation structure, e.g., an isolation structure 145, can be optionally disposed around the collector terminal 121.

Figure 2B:
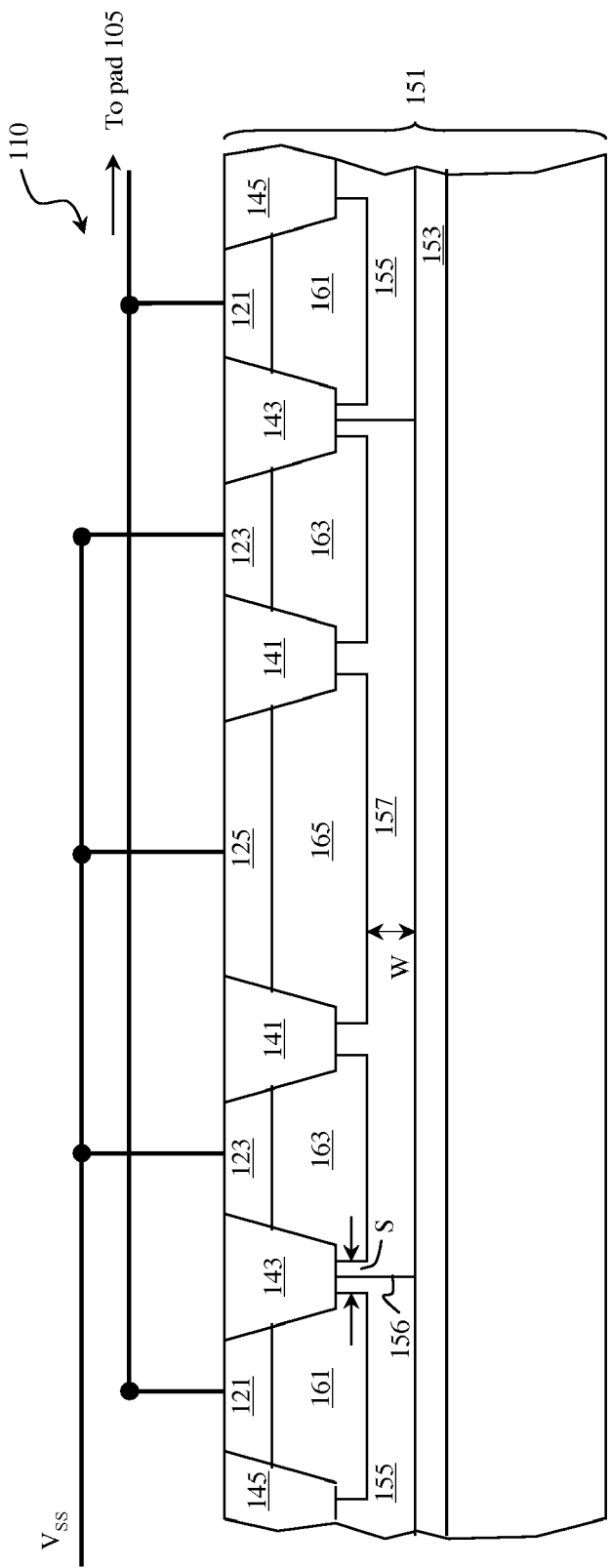
FIG. 2B is a schematic cross-sectional view of an exemplary ESD protection circuit taken along the section line 2B-2B shown in FIG. 2A.

FIG. 2B is a schematic cross-sectional view of the exemplary ESD protection circuit 110 taken along the section line 2B-2B shown in FIG. 2A. In FIG. 2B, the collector terminal 121 can be electrically coupled with a power line that can be electrically coupled with the pad 105. The base terminal 123 and the emitter terminal 125 can be electrically coupled with $V_{SS}$ or ground. The isolation structure 143 can electrically isolate the collector terminal 121 from the base terminal 123.

The isolation structure 141 can electrically isolate the emitter terminal 125 from the base terminal 123. The isolation structure 145 can electrically isolate the bipolar transistor 120 from one or more neighboring ESD finger and/or semiconductor device (not shown).

In some embodiments, the collector terminal 121 and the emitter terminal 125 can have the same conductivity type dopant, e.g., an n-type dopant. The base terminal 123 can have an opposite conductivity type dopant, e.g, a p-type dopant. In some embodiments, the collector terminal 121, the base terminal 123, and the emitter terminal 125 can be formed, for example, by ion implantation processes. In other embodiments, the collector terminal 121 and the emitter terminal 125 can be formed by the same ion implantation process.

In some embodiments, the isolation structures 141, 143, and/or 145 can include at least one shallow trench isolation (STI) structure and/or local oxidation of silicon (LOCOS) structure. The isolation structures 141, 143, and 145 can be formed in a substrate 151, for example, by a STI process or a LOCOS process.

In some embodiments, the substrate 151 can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In other embodiments, the alloy semiconductor substrate may have a gradient SiGe feature in which the Si and Ge composition change from one ratio at one location to another ratio at another location of the gradient SiGe feature. In yet other embodiments, the alloy SiGe is formed over a silicon substrate. In still yet other embodiments, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

In some embodiments, a buried doped region 153, e.g., an n-type buried layer (NBL), can be implanted and/or disposed in the substrate 151. The buried doped region 153 can be formed, for example, by an ion implantation process or an epitaxial process.

Referring to FIG. 2B, deep doped regions 155 and 157 can be formed in the substrate 151 and over the buried doped region 153. The deep doped region 155 can be disposed around the deep doped region 157. In some embodiments, the deep doped region 155 can have a conductivity type dopant, e.g., an n-type dopant. The deep doped region 157 can have an opposite conductivity type dopant, e.g., a p-type dopant. The deep doped regions 155 and 157 can form a junction interface 156. In some embodiments, the junction interface 156 can be referred to as the junction interface of the diode 130 (shown in FIG. 1). In other embodiments, the deep doped regions 155 and 157 can be referred to as a high voltage n-type well (HVNW) and a high voltage p-type well (HVPW), respectively.

In some embodiments, the junction interface 156 can be disposed adjacent the isolation structure 143. In other embodiments, the junction interface 156 can be disposed under the isolation structure 143. For example, the junction interface 156 may contact the beveled sidewall or the flat bottom surface of the isolation structure 143.

Referring to FIG. 2B, shallow doped regions 161, 163, and 165 can be formed in the substrate 151. The shallow doped region 161 can be disposed under and electrically coupled with the collector terminal 121. The shallow doped region 163 can be disposed under and electrically coupled with the base terminal 123. The shallow doped region 165 can be disposed under and electrically coupled with the emitter terminal 125. In some embodiments, the deep doped region 155 can be disposed around and below the shallow doped region 161. The deep doped region 157 can be disposed around and below the shallow doped regions 163 and 165.

In some embodiments, the shallow doped regions 161 and 165 can have the same conductivity type dopant, e.g., an n-type dopant. The shallow doped region 163 can have an opposite conductivity type dopant, e.g., a p-type dopant. In some embodiments, the shallow doped regions 161 and 165 can be referred to as shallow n-type wells. The shallow doped region 163 can be referred to as a shallow p-type well. In some embodiments, the shallow doped regions 161, 163, and 165 can be formed, for example, by ion implantation processes. In other embodiments, the shallow doped regions 161 and 165 can be formed by the same ion implantation process.

In some embodiments, the collector terminal 121 and the emitter terminal 125 can each have a dopant concentration that is higher than a dopant concentration of the shallow doped region 161. In other embodiments, the shallow doped region 161 can have a dopant concentration that is higher than a dopant concentration of the deep doped region 155. In yet other embodiments, the deep doped region 155 can have a dopant concentration that is higher than a dopant concentration of the buried doped region 153.

In some embodiments, the base terminal 123 can have a dopant concentration that is higher than a dopant concentration of the shallow doped region 163. In other embodiments, the shallow doped region 163 can have a dopant concentration that is higher than a dopant concentration of the deep doped region 157. It is noted that the conductivity type dopants of the bipolar terminals, the shallow doped regions, the deep doped regions, and/or the buried doped region are merely exemplary. In some embodiments, opposite type dopants can be applied to the bipolar terminals, the shallow doped regions, the deep doped regions, and/or the buried doped region.

Referring to FIG. 2B, a space S can be defined between side edges (not labeled) of the shallow doped regions 161 and 163. The trigger voltage of the diode 130 (shown in FIG. 1) can be adjusted by changing the space S between the side edges of the shallow doped regions 161 and 163. By changing the trigger voltage, the ESD protection circuit 110 can be adjusted for different output power stages. In some embodiments, each side edge of the shallow doped regions 161 and 163 is spaced from the junction interface 156. In other embodiments, either the side edge of the shallow doped region 161 or the side edge of the shallow doped region 163 contacts the junction interface 156. In still other embodiments, the side edges of both the shallow doped regions 161 and 163 contact the junction interface 156. In this embodiment, the space S is 0.

It is noted that the descriptions regarding the top view and the cross-sectional view of the ESD protection circuit 110 described above in conjunction with FIGS. 2A-2B are merely exemplary. As noted, the isolation structure 143 can be optionally disposed between the collector terminal 121 and the base terminal 123. In some embodiments using the isolation structure 143, the junction interface 156 can be disposed under the isolation structure 143. With this disposition, the breakdown voltage of the diode 130 can be substantially free from being affected by the surface effect. In other embodiments, the isolation structure 143 can be saved. Though maybe affected by the surface effect, the ESD protection circuit without the isolation structure 143 can still protect the internal circuit 101 from being damaged.

In some embodiments, the ESD protection circuit 110 is free from including any metal-oxide-semiconductor field effect transistor (MOSFET). Without the concern that the voltage applied to the pad 105 that may be transferred to gate oxides of MOSFETs, the ESD protection circuit 110 can be disposed below and covered by the pad 105. By disposing the ESD protection circuit 110 directly under the pad 105, no extra silicon area is needed for this ESD protection circuit 110. The chip size of the integrated circuit 100 can be reduced.

In some embodiments, adjusting a resistance of a resistor (not shown) coupled between the collector terminal 121 and the node 131 (shown in FIG. 1) can change a holding voltage of the bipolar transistor 120. The higher the resistance, the higher the holding voltage of the bipolar transistor 120. In some embodiments, the resistance adjustment can be achieved by adjusting at least one dopant concentration of the shallow doped region 161, the deep doped region 155, and the buried doped region 153 (shown in FIG. 2B).

Figure 2C:
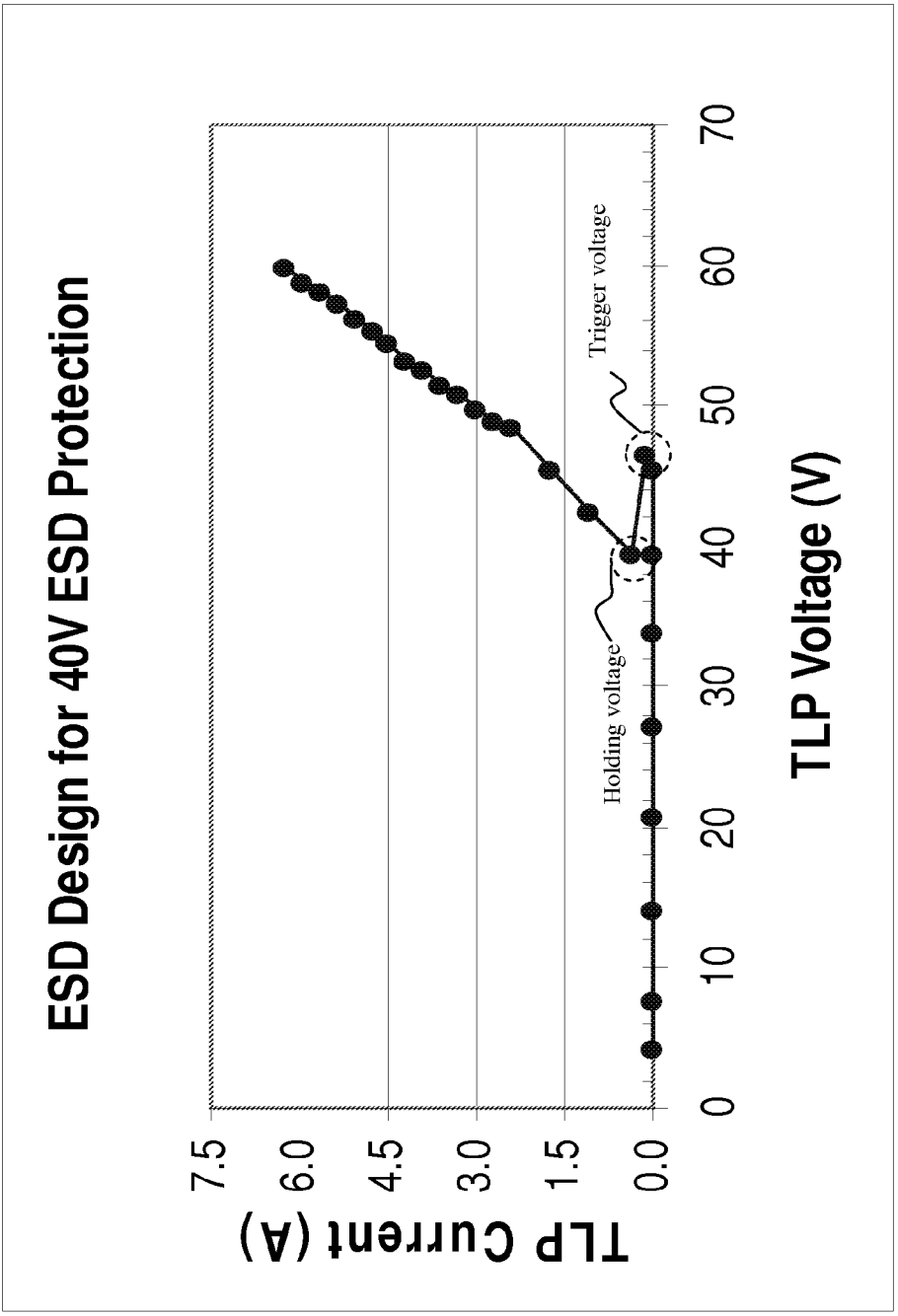
FIGS. 2C-2E are drawings illustrating experimental results derived from ESD protection circuits for different ESD protection voltages.
Figure 2D:
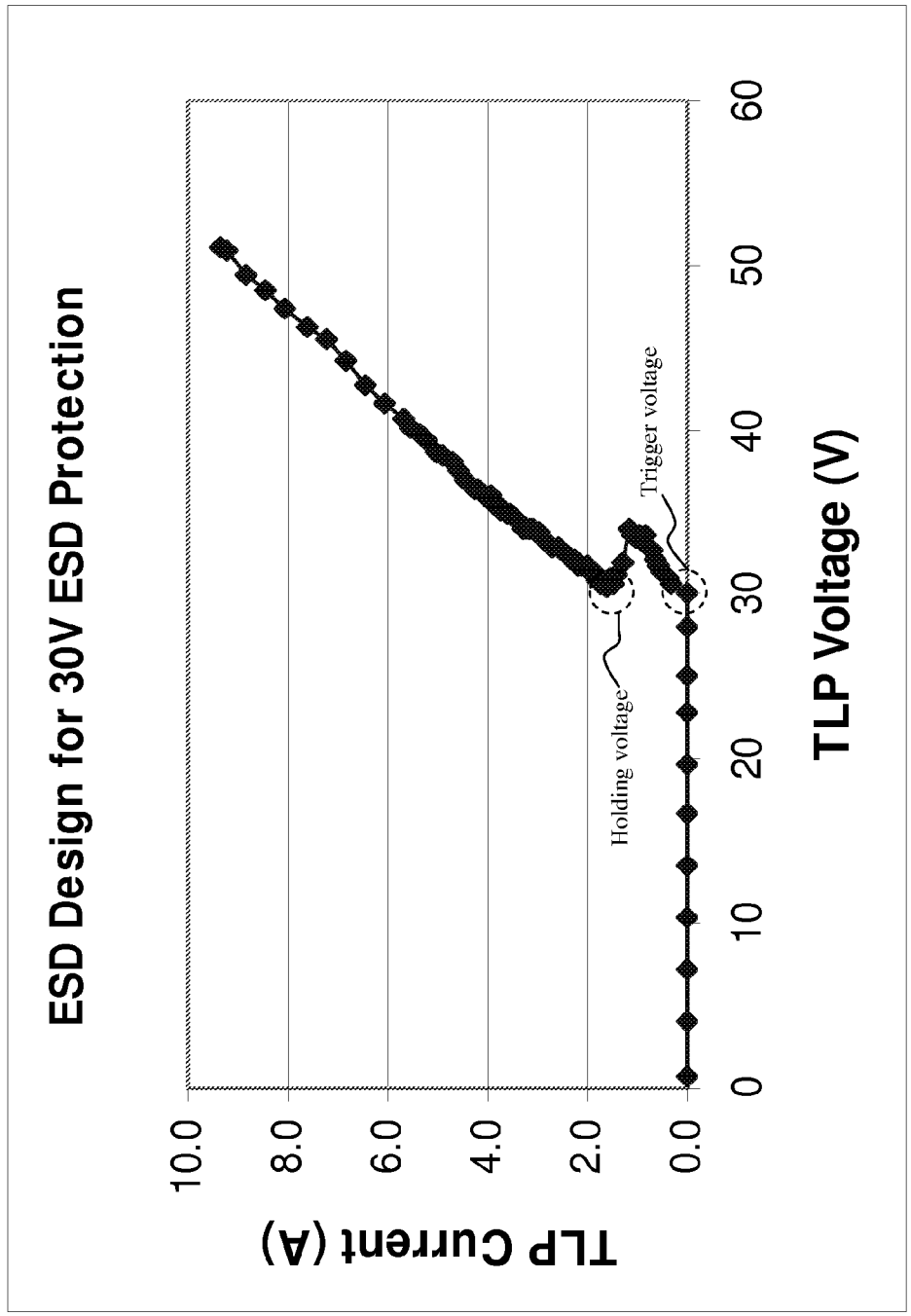
Figure 2E:
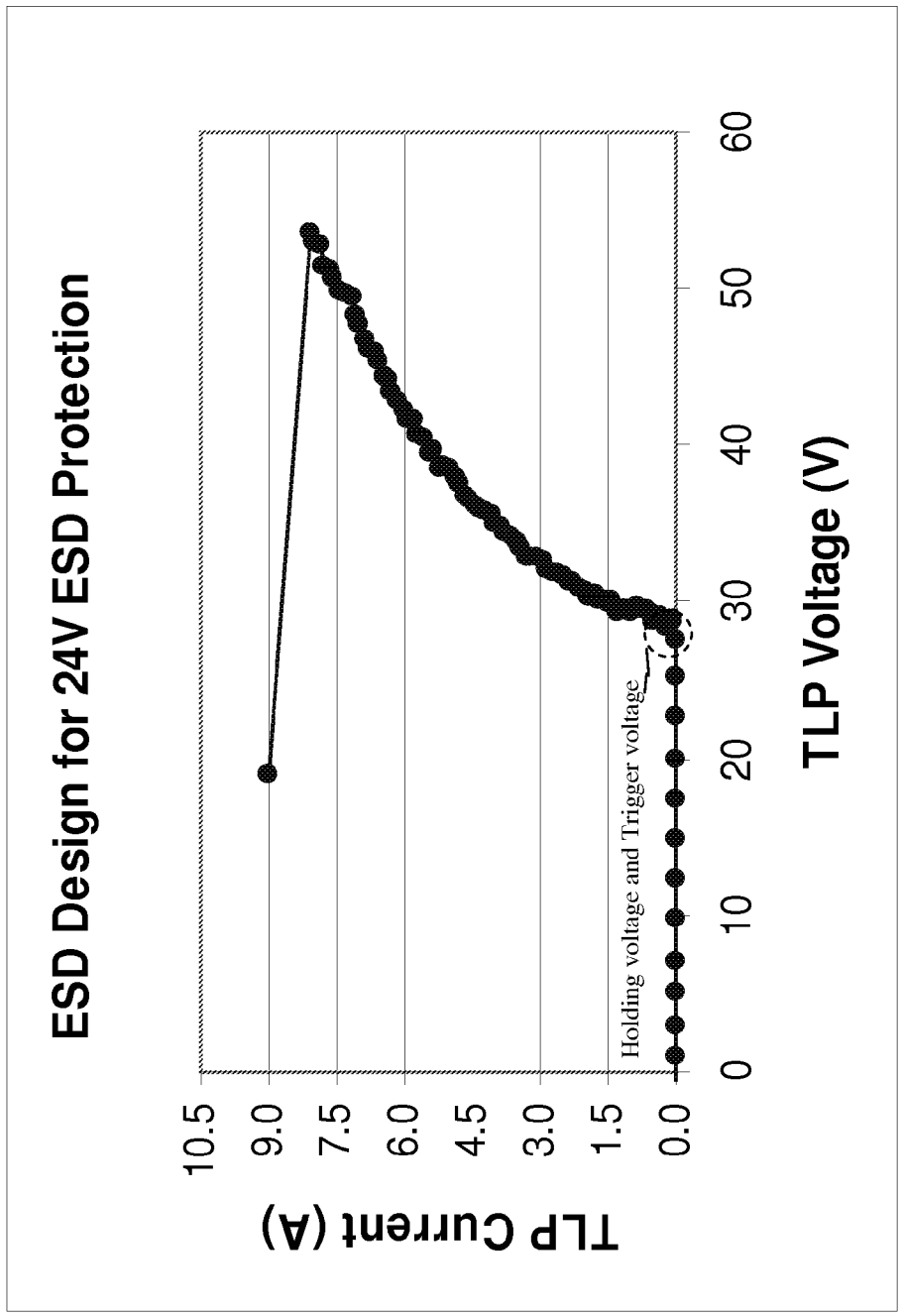

FIGS. 2C-2E are drawings illustrating experimental results derived from ESD protection circuits for different ESD protection voltages. In FIGS. 2C-2E, the experimental results are generated by applying transmission line pulse (TLP) voltages on the ESD protection circuit 110 in which the deep doped region 155 is doped with different dopant concentrations. For 40-V ESD protection circuit in response to FIG. 2C, the trigger voltage of the diode 130 is about 48 V, and the holding voltage of the bipolar transistor 120 is about 40 V. For 30-V ESD protection circuit in response to FIG. 2D, the trigger voltage of the diode 130 is about 35 V, and the holding voltage of the bipolar transistor 120 is about 30 V. For 24-V ESD protection circuit in response to FIG. 2E, the trigger voltage and holding voltages of the diode 130 both are below 29 V. In the ESD protection circuit described above, the dopant concentration of the deep doped region 155 of the 40-V ESD protection circuit is lower than that of the 30-V ESD protection circuit that is lower than the dopant concentration of the deep doped region 155 of the 24-V ESD protection circuit. By increasing the resistance of the deep doped region 155, the holding voltage of the diode 130 can be raised.

It is noted that changing the deep doped region 155 to adjusting the holding voltage of the bipolar transistor 120 is merely exemplary. In some embodiments, the dopant concentrations of the buried doped region 153 and/or the shallow doped region 161 can be adjusted, separately or in combination, to achieve a desired holding voltage.

In some embodiments, the structure shown in FIG. 2B can be repeated one or more (not shown) in the substrate 151. The repeated structure can form one or more combined bipolar/diode structures that can be symmetric or mirrored to the structure shown in FIG. 2B. By using the mirrored structure, a breakdown voltage variation of the diode 130 resulting from at least one titled ion implantation can be reduced. In other embodiments, the repeated structure can be electrically coupled with the bipolar transistor 120 and the diode 130 in a parallel fashion. In other embodiments, the repeated structure can also be disposed under and covered by the pad 105.

In some embodiments, a current gain ($\beta$) of the bipolar transistor 120 can be adjusted, for example, by adjusting a width (W) of the deep doped region 157 and/or the dopant concentration of the deep doped region 157 (shown in FIG. 2B). In some embodiments, the current gain of the bipolar transistor 120 can be increased by reducing the width W of the deep doped region 157. In other embodiments, the current gain of the bipolar transistor 120 can also be increased by reducing the dopant concentration of the deep doped region 157. It is noted that the description regarding adjusting the current gain of the bipolar transistor is merely exemplary. One of skill in the art can modify one or more other factors to achieve a desired current gain.

Figure 3:
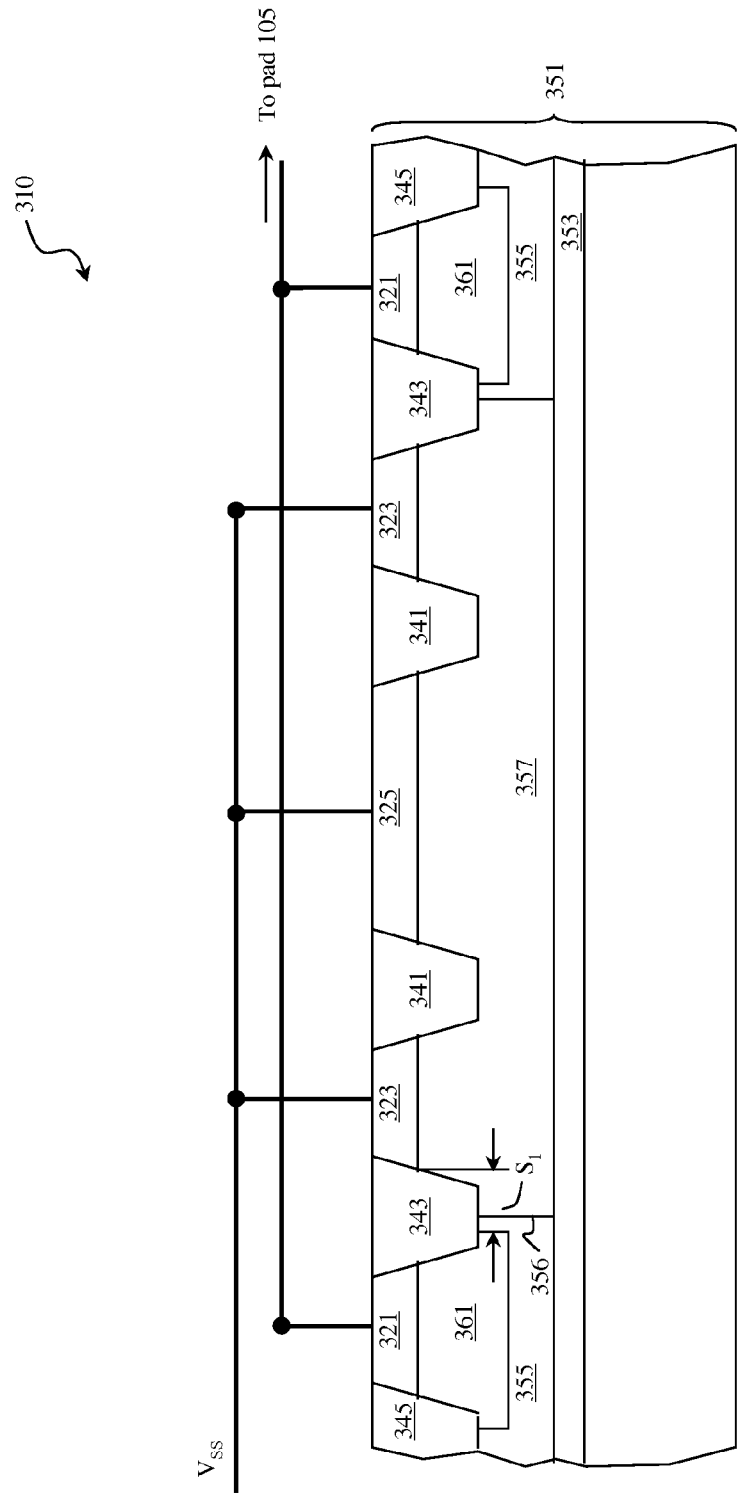
FIG. 3 is a schematic cross-sectional view of a second exemplary ESD protection circuit.

FIG. 3 is a schematic cross-sectional view of a second exemplary ESD protection circuit. Items of an ESD protection circuit 310 in FIG. 3 that are the same or similar items of the ESD protection circuit 110 in FIG. 2B are indicated by the same reference numerals, increased by 200. In FIG. 3, a deep doped region 357 can be disposed around a base terminal 323 and an emitter terminal 325. In some embodiments, the deep doped region 357 can directly contact the base terminal 323 and the emitter terminal 325. In this embodiment, the ESD protection circuit 310 does not include the shallow doped regions 163 and 165 described above in conjunction with FIG. 2B.

Referring to FIG. 3, a space $S_1$ can be defined between the side edge (not labeled) of the shallow doped region 361 and the side edge of the base terminal 323. The trigger voltage of the diode 130 (shown in FIG. 1) can be adjusted by changing the space $S_1$. By changing the trigger voltage, the ESD protection circuit 310 can be adjusted for different output power stages. In some embodiments, the side edge of the shallow doped regions 361 is spaced from a junction interface 356. In other embodiments, the side edge of the shallow doped region 361 can contact the junction interface 356.

Figure 4:
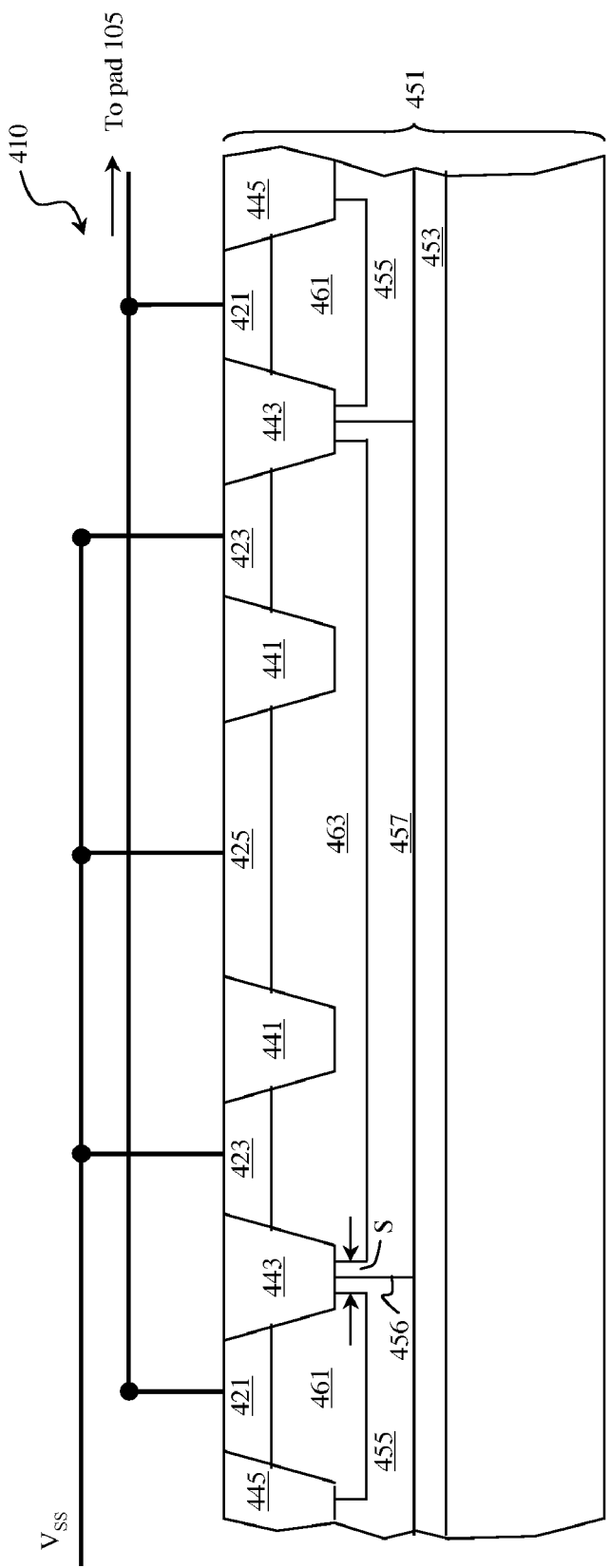
FIG. 4 is a schematic cross-sectional view of a third exemplary ESD protection circuit.

FIG. 4 is a schematic cross-sectional view of a second exemplary ESD protection circuit. Items of an ESD protection circuit 410 in FIG. 4 that are the same or similar items of the ESD protection circuit 110 in FIG. 2B are indicated by the same reference numerals, increased by 300. In FIG. 4, a shallow doped region 463 can be disposed around a base terminal 423 and an emitter terminal 425. In some embodiments, the shallow doped region 463 can directly contact the base terminal 423 and the emitter terminal 425. In this embodiment, the ESD protection circuit 410 does not include the shallow doped region 165 described above in conjunction with FIG. 2B.

The applicants find that, with the same doping conditions of the doped regions, the current gain (β) of the bipolar transistor 120 of the ESD protection circuit 110 is higher than that of the ESD protection circuit 310 that is also higher than that of the ESD protection circuit 410. For example, the current gain (β) of the bipolar transistor 120 of the ESD protection 110 can be about 115, the current gain (β) of the bipolar transistor of the ESD protection 310 can be about 30, and the current gain (β) of the bipolar transistor of the ESD protection circuit 410 can be about 10.

It is noted that the modifications of the ESD protection circuit 110, e.g., adjusting the resistance of the resistor between the collector terminal and the diode, adjusting the holding voltage of the bipolar transistor, the multiple finger structure, the current gain, and/or other modifications, can be applied to the ESD protection circuits 310 and/or 410. It is also noted that the structures of the ESD protection circuits 110, 310, and 410 described above in conjunction with FIGS. 2B, 3, and 4, respectively, are merely exemplary. The structures of the ESD protection circuits 110, 310, and 410 can be modified and/or selected for achieving a suitable current gain of the bipolar transistor.

Figure 5:
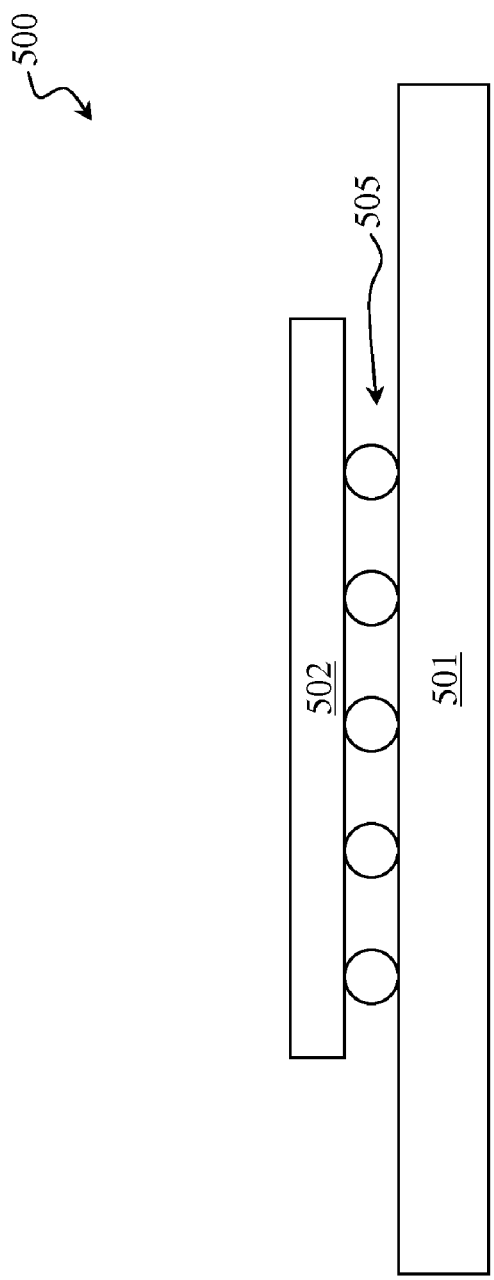
FIG. 5 is a schematic drawing illustrating a system including an exemplary integrated circuit disposed over a substrate board.

FIG. 5 is a schematic drawing illustrating a system including an exemplary integrated circuit disposed over a substrate board. In FIG. 5, a system 500 can include an integrated circuit 502 disposed over a substrate board 501. The substrate board 501 can include a printed circuit board (PCB), a printed wiring board and/or other carrier that is capable of carrying an integrated circuit. The integrated circuit 502 can include an ESD protection circuit that is similar to the ESD protection circuit 110, 310, and 410 described above in conjunction with FIGS. 2B, 3, and 4, respectively. The integrated circuit 502 can be electrically coupled with the substrate board 501. In some embodiments, the integrated circuit 502 can be electrically coupled with the substrate board 501 through bumps 505. In other embodiments, the integrated circuit 502 can be electrically coupled with the substrate board 501 through wire bonding. The system 500 can be part of an electronic system such as computers, wireless communication devices, computer-related peripherals, entertainment devices, or the like.

In embodiments, the system 500 including the integrated circuit 502 can provides an entire system in one IC, so-called system on a chip (SOC) or system on integrated circuit (SOIC) devices. These SOC devices may provide, for example, all of the circuitry needed to implement a radio system, a television, a video apparatus, a satellite broadcast system, an instrumentation system, a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrostatic discharge (ESD) protection circuit, comprising:
    at least one bipolar transistor comprising:
        an emitter terminal of a first conductivity type;
        a base terminal of a second conductivity type, wherein the base terminal is disposed around and electrically isolated from the emitter terminal; and
        a collector terminal of the first conductivity type, wherein the collector terminal is disposed around the base terminal and electrically isolated from the base terminal by the at least one isolation structure;
    at least one isolation structure disposed in a substrate, the at least one isolation structure being configured to electrically isolate two terminals of the at least one bipolar transistor; and
    at least one diode electrically coupled with the at least one bipolar transistor, wherein a junction interface of the at least one diode is disposed adjacent the at least one isolation structure.

2. The ESD protection circuit of claim 1, wherein the at least one diode is configured to trigger the at least one bipolar transistor to release an ESD current.

3. The ESD protection circuit of claim 1, wherein the junction interface of the at least one diode is disposed under the at least one isolation structure, such that a breakdown voltage of the at least one diode is substantially free from being affected by a surface effect.

4. The ESD protection circuit of claim 1, further comprising:

a first shallow doped region of the first conductivity type, wherein the first shallow doped region is disposed under the collector terminal; and a second shallow doped region of the second conductivity type, wherein the second shallow doped region is disposed under the base terminal, and a space is between side edges of the first shallow doped region and the second shallow doped region.

5. The ESD protection circuit of claim 4, wherein a trigger voltage of the at least one diode is determined based on the space between the side edges of the first shallow doped region and the second shallow doped region.

6. The ESD protection circuit of claim 4, further comprising:
a first deep doped region of the first conductivity type, wherein the first deep doped region is disposed around and below the second shallow doped region;
a second deep doped region of the second conductivity type, wherein the second deep doped region is disposed around the first deep doped region; and
a buried doped region of the second conductivity type, wherein the buried doped region is disposed below the first deep doped region.

7. The ESD protection circuit of claim 6, wherein a holding voltage of the at least one bipolar transistor is determined based at least one dopant concentration of the buried doped region, the second deep doped region, and the second shallow doped region.

8. The ESD protection circuit of claim 1, further comprising:
a shallow doped region of the first conductivity type, wherein the shallow doped region is disposed under the collector terminal, wherein a trigger voltage of the at least one diode is determined based on a space between a side edge of the shallow doped region and a side edge of the base terminal; and
a first deep doped region of the first conductivity type, wherein the first deep doped region contacts the base terminal and the emitter terminal;
a second deep doped region of the second conductivity type, wherein the second deep doped region is disposed around the first deep doped region; and
a buried doped region of the second conductivity type, wherein the buried doped region is disposed below the first deep doped region.

9. The ESD protection circuit of claim 1, further comprising:
a first shallow doped region of the first conductivity type, wherein the first shallow doped region is disposed under the collector terminal;
a second shallow doped region of the second conductivity type, wherein the second shallow doped region directly contacts the base terminal and the emitter terminal;
a first deep doped region of the first conductivity type, wherein the first deep doped region is disposed under the shallow doped region;
a second deep doped region of the second conductivity type, wherein the second deep doped region is disposed around the first deep doped region and the shallow doped region; and
a buried doped region of the second conductivity type, wherein the buried doped region is disposed below the first deep doped region.

10. The ESD protection circuit of claim 1, wherein the at least one bipolar transistor, the at least one isolation structure, and the at least one diode are disposed below and covered by a pad that is electrically coupled with the ESD protection circuit.

11. An electrostatic discharge (ESD) protection circuit, comprising:
at least one bipolar transistor, wherein the at least one bipolar transistor comprises an emitter terminal, a base terminal, and a collector terminal; and
at least one diode electrically coupled with the at least one bipolar transistor, wherein the at least one diode comprises:
a first shallow doped region of a first conductivity type, wherein the first shallow doped region is disposed under the collector terminal; and
a second shallow doped region of a second conductivity type, wherein the second shallow doped region is disposed under the base terminal, and a trigger voltage of the at least one diode is determined based on a space between side edges of the first shallow doped region and the second shallow doped region.

12. The ESD protection circuit of claim 11, further comprising:
at least one isolation structure disposed in a substrate, wherein the at least one isolation structure is disposed between the base terminal and the collector terminal.

13. The ESD protection circuit of claim 12, wherein a junction interface of the at least one diode is disposed under the at least one isolation structure such that a breakdown voltage of the at least one diode is substantially free from being affected by a surface effect.

14. The ESD protection circuit of claim 11, wherein
the emitter terminal has the first conductivity type;
the base terminal has the second conductivity type, wherein the base terminal is disposed around and electrically isolated from the emitter terminal; and
the collector terminal has the first conductivity type, wherein the collector terminal is disposed around the base terminal and electrically isolated from the base terminal by the at least one isolation structure.

15. The ESD protection circuit of claim 14 further comprising:
a first deep doped region of the first conductivity type, wherein the first deep doped region is disposed around and below the second shallow doped region;
a second deep doped region of the second conductivity type, wherein the second deep doped region is disposed around the first deep doped region; and
a buried doped region of the second conductivity type, wherein the buried doped region is disposed below the first deep doped region.

16. The ESD protection circuit of claim 15, wherein a holding voltage of the at least one bipolar transistor is determined based on at least one dopant concentration of the buried doped region, the second deep doped region, and the second shallow doped region.

17. The ESD protection circuit of claim 11, wherein the at least one bipolar transistor and the at least one diode are disposed below and covered by a pad that is electrically coupled with the ESD protection circuit.

18. An electrostatic discharge (ESD) protection circuit, comprising:
at least one bipolar transistor, wherein the at least one bipolar transistor comprises an emitter terminal, a base terminal, and a collector terminal;

at least one isolation structure disposed in a substrate, wherein the at least one isolation structure is disposed between the base terminal and the collector terminal; and at least one diode electrically coupled with the at least one bipolar transistor, wherein a junction interface of the at least one diode is disposed under the at least one isolation structure, and wherein the at least one diode comprises:

a first shallow doped region of a first conductivity type, wherein the first shallow doped region is disposed under the collector terminal; and a second shallow doped region of a second conductivity type, wherein the second shallow doped region is disposed under the base terminal.

19. The ESD protection circuit of claim 18, wherein the junction interface of the at least one diode is disposed under the at least one isolation structure such that a breakdown voltage of the at least one diode is substantially free from being affected by a surface effect.

20. The ESD protection circuit of claim 18 further comprising:

a first deep doped region of the first conductivity type, wherein the first deep doped region is disposed around and below the second shallow doped region;

a second deep doped region of the second conductivity type, wherein the second deep doped region is disposed around the first deep doped region; and a buried doped region of the second conductivity type, wherein the buried doped region is disposed below the first deep doped region, wherein a holding voltage of the at least one bipolar transistor is determined based on at least one dopant concentration of the buried doped region, the second deep doped region, and the second shallow doped region.

* * * * *